(12) United States Patent
Yang et al.

(10) Patent No.: US 11,581,885 B2
(45) Date of Patent: Feb. 14, 2023

(54) PRE-CHARGE CONTROL CIRCUIT AND METHOD OF CONTROLLING THE SAME

(71) Applicant: DELTA ELECTRONICS, INC., Taoyuan (TW)

(72) Inventors: Li-Ching Yang, Taoyuan (TW); Wen-Lung Huang, Taoyuan (TW); Sheng-Hua Li, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 35 days.

(21) Appl. No.: 17/011,370

(22) Filed: Sep. 3, 2020

(65) Prior Publication Data

US 2021/0203317 A1 Jul. 1, 2021

(30) Foreign Application Priority Data

Dec. 30, 2019 (CN) .......................... 201911397097.3

(51) Int. Cl.
*H03K 17/0812* (2006.01)
*H02M 3/158* (2006.01)

(52) U.S. Cl.
CPC ...... *H03K 17/08122* (2013.01); *H02M 3/158* (2013.01)

(58) Field of Classification Search
CPC .......................... H03K 17/08122; H02M 3/158
See application file for complete search history.

(56) References Cited

U.S. PATENT DOCUMENTS

| 9,094,012 | B2* | 7/2015 | Tabata ................. H03K 17/167 |
| 2011/0248691 | A1 | 10/2011 | Williams |
| 2013/0009672 | A1* | 1/2013 | Olivo ..................... H03K 17/163 327/109 |
| 2016/0301235 | A1 | 10/2016 | Okanoue |
| 2017/0279359 | A1 | 9/2017 | Goncalves et al. |
| 2020/0153336 | A1* | 5/2020 | Mihai ..................... H02J 3/381 |

FOREIGN PATENT DOCUMENTS

| CN | 106463955 A | 2/2017 |
| CN | 109639144 A | 4/2019 |
| TW | 201240352 A | 10/2012 |
| WO | WO 2019/021159 A1 | 1/2019 |

* cited by examiner

*Primary Examiner* — Ryan Johnson
*Assistant Examiner* — Colleen J O Toole
(74) *Attorney, Agent, or Firm* — Muncy, Geissler, Olds & Lowe, P.C.

(57) ABSTRACT

A pre-charge control circuit includes a control unit, a conversion unit, and a pre-charge switch. The control unit provides a control signal according to a PWM signal, and the conversion unit provides a control voltage according to the control signal. The pre-charge switch adjusts a magnitude of the current flowing through the input path of the electronic circuit according to the control voltage.

16 Claims, 4 Drawing Sheets

PRE-CHARGE CONTROL CIRCUIT AND METHOD OF CONTROLLING THE SAME

BACKGROUND

Technical Field

The present disclosure relates to a pre-charge control circuit and a method of controlling the same, and more particularly to pre-charge control circuit and a method of controlling the same that use only transistors to couple input paths to an electronic circuit.

Description of Related Art

The statements in this section merely provide background information related to the present disclosure and do not necessarily constitute prior art.

Nowadays, in the technical field of electronic circuits, the requirements for the power consumption and efficiency of electronic circuits are increasingly emphasized, therefore more and more circuit designs aim at reducing the power consumption of electronic circuits and improving efficiency. Especially the suppression of surge current is the focus of circuit design. The reason is that, in addition to the extra power consumption of the electronic circuit caused by the surge current, if the peak value of the current is too high, it will cause breakdown of the internal components of the electronic circuit and cause damage, resulting in a situation that the electronic circuit cannot normally operate. Especially in applications where the input is a high voltage (for example but not limited to, the input power is above 1000 volts), the condition of additional power consumption and breakdown components caused by the surge current is even more significant.

The cause of the surge current is that when the electronic circuit is powered on, two ends of an input capacitor are close to short circuit. Therefore, when the input power is just coupled to the electronic circuit, there will be an instantaneous large current into the input capacitor, and this current is the surge current. In this situation, a resistor is usually added to the input path of the electronic circuit to suppress the peak value of the generated surge current. However, in normal operation of the electronic circuit (that is, when there is no surge current), because the resistor exists in the current path, it will cause additional power consumption and increase the internal temperature of the electronic circuit. To solve this problem, the conventional electronic circuit used a switch to be in parallel with the resistor. When the electronic circuit is operating in a steady state, the switch is turned on to bypass the resistor, thereby saving power consumption.

However, when the switch is damaged, the current will flow through the resistor in normal operation. The simple detection can only know that the power consumed by the electronic circuit is increased, but it is not easy to detect what caused the increase in power consumption. As a result, additional power consumption is generated, resulting in a low overall circuit efficiency.

Accordingly, how to design a pre-charge control circuit and a control method thereof, and use only a pre-charge switch coupled to the input path of the electronic circuit to perform pre-charge control of the electronic circuit to achieve the effect of suppressing the peak value of the surge current is an important subject for the inventor's research.

SUMMARY

In order to solve the above-mentioned problems, the present disclosure provides a pre-charge control circuit. The pre-charge control circuit includes a control unit, a conversion unit, and a pre-charge switch. The control unit provides a control signal according to a pulse width modulation signal. The conversion unit is coupled to the control unit and provides a control voltage according to the control signal. The pre-charge switch is coupled to the conversion unit and an input path of an electronic circuit. The pre-charge switch adjusts a magnitude of a current flowing through the input path of the electronic circuit according to the control voltage.

In order to solve the above-mentioned problems, the present disclosure provides a method of controlling a pre-charge control circuit. The method of controlling the pre-charge control circuit includes steps of: providing a pre-charge switch coupled to an input path of an electronic circuit, providing a control signal to a conversion unit according to a pulse width modulation signal, providing a control voltage, by the conversion unit, according to the control signal, and changing a current flowing through the pre-charge switch, according to the control voltage.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Figure 1A:
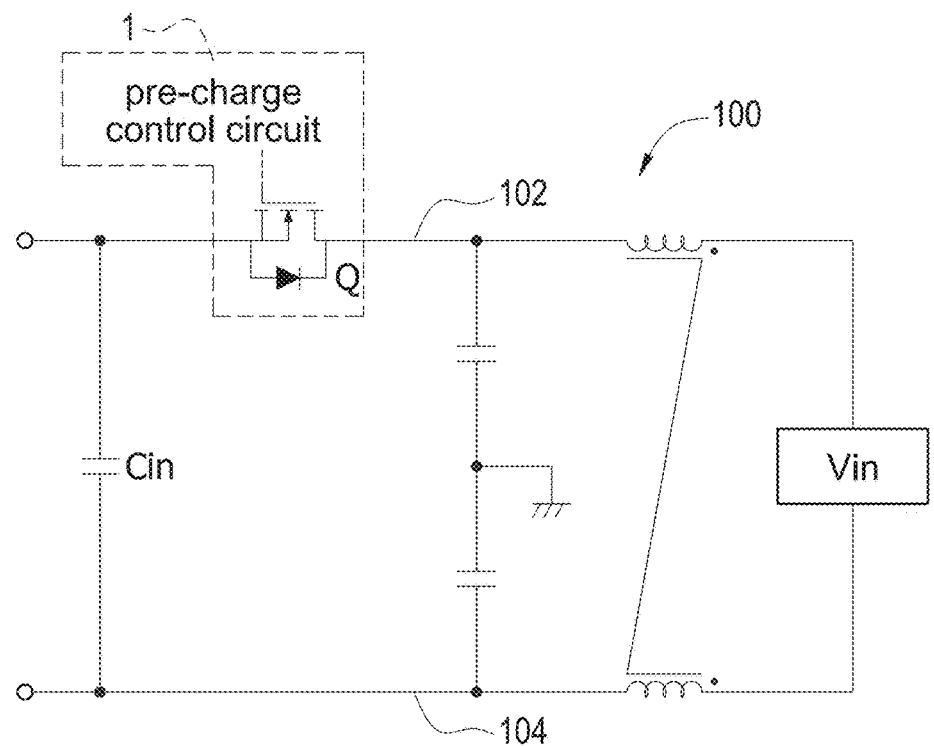
FIG. 1A is a block circuit diagram of a pre-charge control circuit cooperated with an electronic circuit according to a first embodiment of the present disclosure.

Reference will now be made to the drawing figures to describe the present disclosure in detail. It will be understood that the drawing figures and exemplified embodiments of present disclosure are not limited to the details thereof.

Figure 1B:
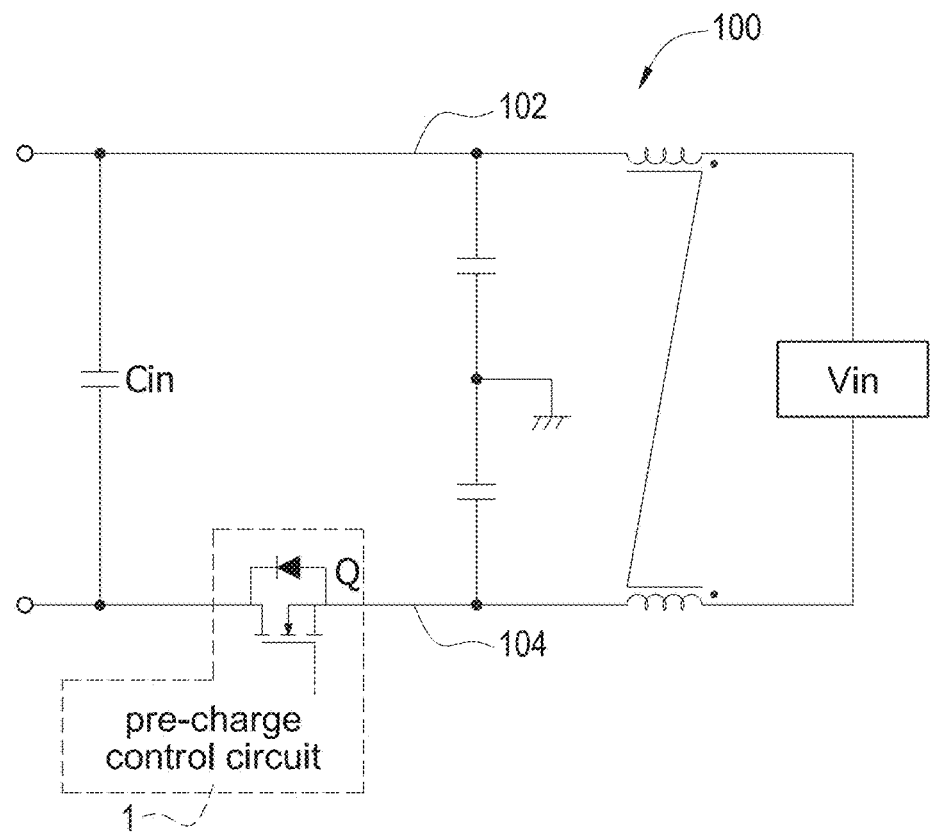
FIG. 1B is a block circuit diagram of the pre-charge control circuit cooperated with the electronic circuit according to a second embodiment of the present disclosure.

Please refer to FIG. 1A and FIG. 1B. FIG. 1A shows a block circuit diagram of a pre-charge control circuit cooperated with an electronic circuit according to a first embodiment of the present disclosure, and FIG. 1B shows a block circuit diagram of the pre-charge control circuit cooperated with the electronic circuit according to a second embodiment of the present disclosure. The electronic circuit 100 receives an input power source Vin and pre-charges an input capacitor Cin so that the input capacitor Cin can provide the required voltage for the electronic circuit 100. In particular, the input power source Vin is, for example but not limited to, provided by a solar panel, a battery, or a DC parallel side of a modular power converter. The pre-charge control circuit 1 is coupled to an input path of the electronic circuit 100 for controlling the pre-charge of the electronic circuit 100. Specifically, when the input power source Vin is not yet coupled to the electronic circuit 100, the input capacitor Cin has not stored energy and is close to a short circuit. When the input power source Vin is just coupled to the electronic circuit 100, a large surge current will be generated so that the components inside the electronic circuit 100 may be broken down and damaged. Therefore, it is necessary to use the pre-charge control circuit 1 to pre-charge the electronic circuit 100 when the input power source Vin is just coupled to the electronic circuit 100 to reduce the peak value of the surge current and avoid occurring the above-mentioned situation. As shown in FIG. 1A, the pre-charge control circuit 1 can be coupled to a first end 102 of the input path of the electronic circuit 100, that is, between a positive end of the input power source Vin and the input capacitor Cin. Alternatively, as shown in FIG. 1B, the pre-charge control circuit 1 can be coupled to a second end 104 of the input path of the electronic circuit 100, that is, between a negative end of the input power source Vin and the input capacitor Cin. The pre-charge control circuit 1 placed in any of the above-mentioned coupling positions can achieve pre-charge control of the input capacitor Cin when the input power source Vin starts to charge the input capacitor Cin, thereby reducing the peak value of the surge current.

Further, the main purpose of the present disclosure is that the pre-charge control circuit 1 only uses the pre-charge switch Q to be coupled to the input path of the electronic circuit 100 to control the pre-charge of the electronic circuit 100. By controlling the working region of the pre-charge switch Q to determine the conduction degree of the pre-charge switch Q, the present disclosure does not need a parallel-connected resistor as in the conventional technology. Therefore, it is possible to achieve complete isolation of the voltage across the pre-charge switch Q, and it is easy to detect whether the pre-charge switch Q is damaged. In particular, the pre-charge switch Q may be a semiconductor-type switch component, such as but not limited to, a metal-oxide-semiconductor field-effect transistor (MOSFET) or an insulated gate bipolar transistor (IGBT). For convenience of explanation, FIG. 1A and FIG. 1B take the pre-charge switch Q as the metal-oxide-semiconductor field-effect transistor (MOSFET) as an example. In addition, since the pre-charge control circuit 1 of the present disclosure does not include a parallel-connected resistor, when the pre-charge switch Q is damaged, additional power consumption of the electronic circuit 100 or the increased internal ambient temperature of the electronic circuit 100 does not occur due to power flowing through the resistor.

Figure 2:
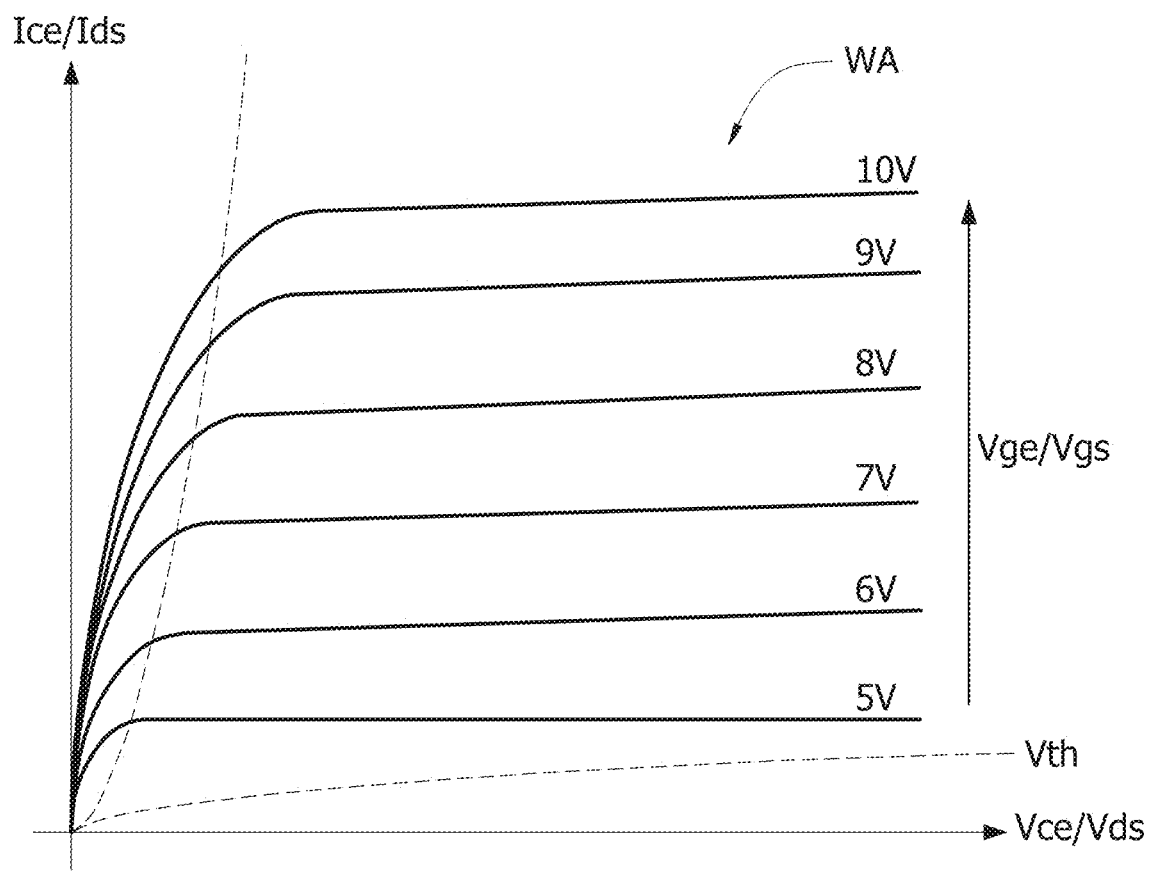
FIG. 2 is a schematic waveform of a work region of a pre-charge switch according to the present disclosure.

Please refer to FIG. 2, which shows a schematic waveform of a work region of a pre-charge switch according to the present disclosure, and also refer to FIG. 1A and FIG. 1B. Taking the pre-charge switch Q as a metal-oxide-semiconductor field-effect transistor as an example, the working region WA of the pre-charge switch Q is a saturation region. The horizontal axis of FIG. 2 is the voltage difference Vds from the input end D to the output end S of the MOSFET, and the vertical axis in FIG. 2 is the magnitude of current Ids flowing from the input end D to the output end S of the MOSFET. Each curve represents the relationship between the voltage difference Vds of the input end D and the output end S and the magnitude of current Ids when different voltage differences Vgs (hereinafter referred to as control voltage Vgs) are applied to the control end G and the output end S of the MOSFET. When the control voltage Vgs of the MOSFET is lower than the threshold value (i.e., the control voltage Vgs is lower than the threshold voltage Vth), the pre-charge switch Q does not establish a channel so that the input end D and the output end S of the pre-charge switch Q is open circuit and no current flows through the input end and the output end S (i.e., Ids=0). When the control voltage Vgs at the control end G and the output end S of the pre-charge switch Q gradually rises (i.e., the control voltage Vgs is greater than the threshold voltage and gradually increases), a channel is established between the input end D and the output end S of the pre-charge switch Q, and the channel gradually becomes larger (i.e., the control voltage Vgs is gradually increased from 5 volts to 10 volts) so that the magnitude of current Ids that can flow through the input end D and the output end S gradually increases.

By gradually turning on the pre-charge switch Q, the magnitude of current Ids that can flow through the input end D and the output end S of the pre-charge switch Q can be gradually increased so that the pre-charge control circuit 1 can limit the magnitude of current flowing through the input end D and the output end S of the pre-charge switch Q when the input power source Vin is just coupled to the electronic circuit 100, thereby reducing the peak value of the surge current. After the charging of the input capacitor Cin is completed, the pre-charge switch Q is completely turned on so that the current Ids can all flow through the pre-charge switch Q to save the power loss of the electronic circuit 100. When the pre-charge switch Q is damaged, the input path of the electronic circuit 100 is open circuit, and the damaged pre-charge switch Q may be simply detected. Alternatively, if an insulated gate bipolar transistor (IGBT) is used for the pre-charge switch Q, the working region of the pre-charge switch Q is the active region. Its horizontal axis is the voltage difference Vce from the input end C to the output end E of the insulated gate bipolar transistor, and its vertical axis is the magnitude of current Ice flowing from the input end C to the output end E of the insulated gate bipolar transistor. Each curve represents the relationship between the voltage difference Vce and the magnitude of current Ice of the input end C and the output end E when different voltage differences Vge (hereinafter referred to as control voltage Vge) are applied to the control end G and the output end E of the insulated gate bipolar transistor. The effect and control manner is also to control the magnitude of current Ice that can flow through the input end C and the output end E by adjust the control voltage (i.e., the Vge), which will not be repeated here.

Figure 3A:
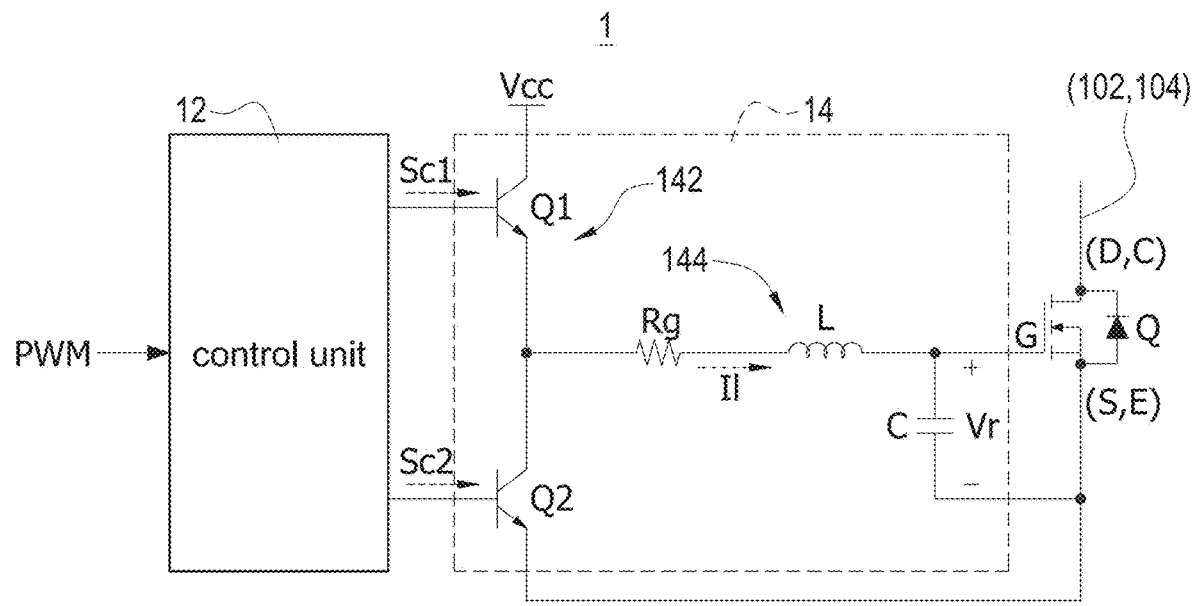
FIG. 3A is a block circuit diagram of the pre-charge control circuit according to a first embodiment of the present disclosure.

Please refer to FIG. 3A, which shows a block circuit diagram of the pre-charge control circuit according to a first embodiment of the present disclosure, and also refer to FIG. 1A to FIG. 2. The pre-charge control circuit 1 includes a control unit 12, a conversion unit 14, and a pre-charge switch Q. The conversion unit 14 is coupled to the control unit 12 and the pre-charge switch Q. The control unit 12 receives a pulse width modulation signal PWM and provides control signals Sc1, Sc2 to the conversion unit 14 according to the pulse width modulation signal PWM. The conversion unit 14 receives the control signals Sc1, Sc2 and converts a work voltage Vcc into a control voltage Vr to the pre-charge switch Q according to the control signals Sc1, Sc2. The pre-charge switch Q is coupled to the input path via a first end 102 or a second end 104 of the input path of the electronic circuit 100, and the control end G and the output end S (or E) gradually establishes a channel by receiving the control voltage Vr whose voltage value gradually increases so as to gradually turn on the input path. Therefore, the magnitude of current Ids (or Ice) that flow through the input end D (or C) and the output end S (or E) of the pre-charge switch Q gradually increase In one embodiment, the work voltage Vcc can be provided by the electronic circuit 100 or external electronic devices.

The pulse width modulation signal PWM can be provided by a controller inside the electronic circuit 100 or external electronic devices. The pulse width modulation signal PWM can be provided by an analog controller or a digital controller. The pulse width modulation signal PWM is a signal with gradually increased duty cycle so that duty cycles of the control signals Sc1, Sc2 provided to the conversion unit 14 from the control unit 12 are gradually increased. Due to the gradually increased duty cycles of the control signals Sc1, Sc2, a voltage level of the control voltage Vr outputted from the conversion unit 14 is also gradually increased. Therefore, the pre-charge switch Q is gradually turned on by the control voltage Vr with gradually increased voltage level. In particular, the best way to increase the duty cycle is to increase it at equal magnifications, so that the voltage value of the control voltage Vr is also increase at equal magnifications. In one preferred embodiment, the duty cycles of the control signals Sc1, Sc2 are increased by 1%, but not limited thereto. Therefore, the pre-charge switch Q will not be turned on too slowly to prolong the startup time of the electronic circuit 100, or the pre-charge switch Q will not be turned on too fast to affect the peak current surge suppression effect, so that the best surge current suppression effect is achieved. The present disclosure utilizes the operation characteristics of the transistor so that the pre-charge control circuit 1 only needs to control the duty cycle of the PWM signal to control the magnitude of current flowing through the pre-charge switch Q.

Specifically, the conversion unit 14 includes a switching unit 142 and a filter unit 144, and a buck converter is composed of the control unit 12, the switching unit 142, and the filter unit 144. The switching unit 142 includes an upper bridge switch Q1 and a lower bridge switch Q2. The upper bridge switch Q1 is coupled to the work voltage Vcc and the control unit 12, and the lower bridge switch Q2 is coupled to the upper bridge switch Q1, the control unit 12, and an output end (S, E) of the pre-charge switch Q. The filter unit 144 includes an inductor L and a capacitor C. One end of the inductor L is coupled to a common-connected contact between the upper bridge switch Q1 and the lower bridge switch Q2, and the other end of the inductor L is coupled to one end of the capacitor C and a control end G of the pre-charge switch Q. The other end of the capacitor C is coupled to the output end (S, E) of the pre-charge switch Q so as to establish the control voltage Vr that gradually turns on the pre-charge switch Q between the control end G and the output ends (S, E) of the pre-charge switch Q. In one embodiment, the control unit 12, the switching unit 142, and the filter unit 144 may also constitute, for example but not limited to, a switching converter such as a boost converter. All of them can generate the control voltage Vr by switching the control switch, and the difference is only in the circuit cost of the circuit structure and the difficulty of the control manner. In other words, the buck converter has a simple circuit structure and low cost, and the control manner is also the simplest.

The upper bridge switch Q1 receives the upper bridge control signal Sc1 of the control signals Sc1, Sc2 and the lower bridge switch Q2 receives the lower bridge control signal Sc2, and the upper bridge control signal Sc1 and the lower bridge control signal Sc2 are complementary. When the upper bridge switch Q1 is turned on by the upper bridge control signal Sc1, the lower bridge switch Q2 is turned off by the lower bridge control signal Sc2. At this condition, in the transient condition with the same duty cycle, the work voltage Vcc stores energy to the inductor L through the upper bridge switch Q1 so that the inductor current Il generated by the inductor L charges the capacitor. Therefore, the voltage value of the control voltage Vr across the capacitor C starts to increase. Afterward, the upper bridge switch Q1 is turned off by the upper bridge control signal Sc1 and the lower bridge switch Q2 is turned on by the lower bridge control signal Sc2. At this condition, the inductor L, the capacitor C, and the lower bridge switch Q2 form a closed loop, and the inductor current Il of the inductor L gradually decreases to release energy to the capacitor C. Afterward, in the steady state, the voltage value of fixed control voltage Vr can be obtained according to the volt-second balance principle. As the duty cycle of the control signals Sc1, Sc2 are gradually increased, the switching unit 142 gradually increases the turned-on time to switch on, thereby increasing the control voltage Vr. In one embodiment, the rising slope of the voltage value of the control voltage Vr is related to the increase rate of the duty cycle of the control signals Sc1, Sc2, but the voltage value of the control voltage Vr is not limited to be increased by a fixed slope, and it can also be increased by a non-fixed slope (such as exponential or logarithmic manner).

The conversion unit 14 further includes a current limit resistor Rg, and the current limit resistor Rg is coupled between the upper bridge switch Q1, the lower bridge switch Q2 and the inductor L. Since the conversion unit 14 is not in operation and the capacitor C has no voltage and is close to short circuit, when the conversion unit 14 starts to operate and the upper bridge switch Q1 is turned on, an instantaneous large current flows through the filter unit 144, which causes the voltage value of the control voltage Vr to be instantaneously too high, and the pre-charge switch Q is turned on in unexpected circumstances. Therefore, when the upper bridge switch Q1 is turned on, the current limit resistor Rg will limit the magnitude of the turned-on current flowing from the work voltage Vcc through the upper bridge switch Q1, the inductor L to the capacitor C so as to prevent the pre-charge switch Q from malfunctioning or turning on in unexpected circumstances, and further protect the upper bridge switch Q1 from being damaged due to a large current. In particular, the current limit resistor Rg can also be called a drive resistor.

Figure 3B:
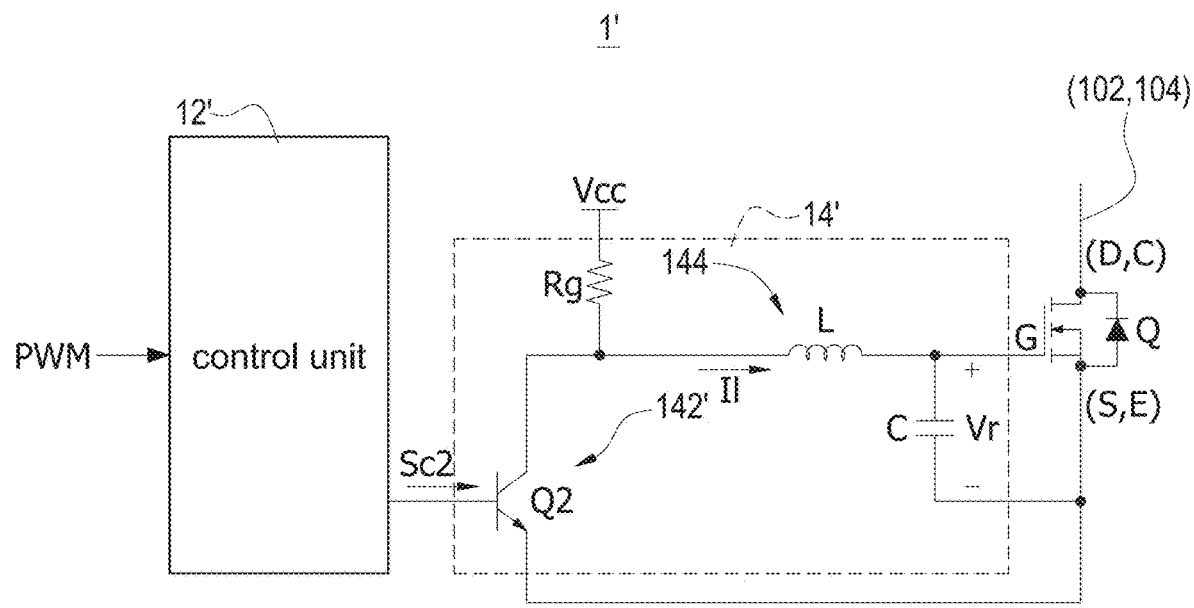
FIG. 3B is a block circuit diagram of the pre-charge control circuit according to a second embodiment of the present disclosure.

Please refer to FIG. 3B, which shows a block circuit diagram of the pre-charge control circuit according to a second embodiment of the present disclosure, and also refer to FIG. 1A to FIG. 3A. The difference between the pre-charge control circuit 1' of this embodiment and the pre-charge control circuit 1 of FIG. 3A is that the switching unit 142' only has a lower bridge switch Q2, and the control unit 12' only provides the control signal Sc2 (i.e., the lower bridge control signal) to the lower bridge switch Q2. The lower bridge switch Q2 is coupled to the work voltage Vcc, the inductor L, and the output end (S, E), and is switched on by the lower bridge control signal Sc2. When the lower bridge control signal Sc2 is a first level (i.e., the low level), the lower bridge switch Q2 is not turned on, and the work voltage Vcc stores energy in the inductor L so that the inductor current Il generated by the inductor L charges the capacitor C. Therefore, the voltage value of the control voltage Vr across the capacitor C starts to increase. Afterward, when the lower bridge control signal Sc2 is a second level (i.e., the high level), the lower bridge switch Q2 is turned on. At this condition, the inductor L, the capacitor C, and the lower bridge switch Q2 form a closed loop, and the inductor current Il of inductor L gradually decreases to release energy to the capacitor C. The detailed operation process is as described in the previous paragraph, and finally the voltage of the control voltage Vr is stably controlled at a fixed value. Further, the circuit coupling manner and control manner that are not mentioned in FIG. 3B are the same as those in FIG. 3A and will not be repeated here.

The conversion unit 14' further includes the current limit resistor Rg. The current limit resistor Rg is coupled between the work voltage Vcc, the lower bridge switch Q2, and the inductor L, and its function is equivalent to the current limit resistor Rg of FIG. 3A. The coupling position of the current limit resistor Rg in FIG. 3A may also be the same as the coupling position of FIG. 3B. In other words, the current limit resistor Rg is coupled between the work voltage Vcc and the upper bridge switch Q1, and has the same effect as the current limit resistor Rg is coupled between the upper bridge switch Q1, the lower bridge switch Q2, and the inductor L. In particular, the current limit resistor Rg can also be called a drive resistor. In addition, the pulse width modulation signal PWM, the control units 12,12', the upper bridge switch Q1, and the lower bridge switch Q2 in FIG. 3A and FIG. 3B can be practically integrated in a drive IC.

Figure 4:
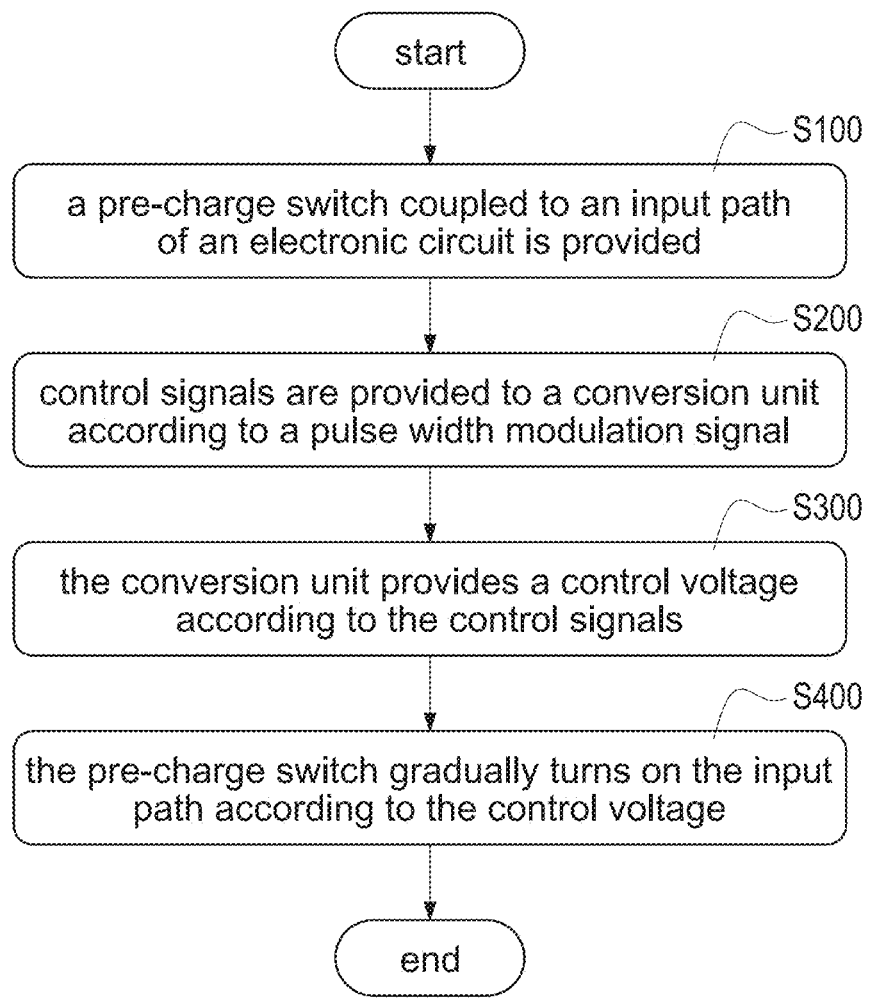
FIG. 4 is a flowchart of controlling the pre-charge control circuit according to the present disclosure.

Please refer to FIG. 4, which shows a flowchart of controlling the pre-charge control circuit according to the present disclosure, and also refer to FIG. 1A to FIG. 3B. The method of controlling a pre-charge control circuit includes the following steps. First, a pre-charge switch coupled to an input path of an electronic circuit is provided (S100). The pre-charge switch Q may be coupled to a first end 102 or a second end 104 of the input path of the electronic circuit 100 to control the pre-charging of the electronic circuit 100 when an input power source Vin is just coupled to the electronic circuit 100. Afterward, control signals are provided to a conversion unit according to a pulse width modulation signal (S200). A control unit 12 receives the pulse width modulation signal PWM and provides the control signals Sc1, Sc2 to the conversion unit 14 according to the pulse width modulation signal PWM. The pulse width modulation signal PWM can be provided by a controller inside the electronic circuit 100 or external electronic devices. The pulse width modulation signal PWM can be provided by an analog controller or a digital controller. The pulse width modulation signal PWM is a signal with gradually increased duty cycle so that duty cycles of the control signals Sc1, Sc2 provided to the conversion unit 14 from the control unit 12 are gradually increased.

Afterward, the conversion unit provides a control voltage according to the control signals (S300). The conversion unit 14 receives the control signals Sc1, Sc2, and converts the work voltage Vcc into the control voltage Vr to the pre-charge switch Q according to the control signals Sc1, Sc2. As the duty cycles of the control signals Sc1, Sc2 gradually increase, the voltage value of the control voltage Vr outputted by the conversion unit 14 also gradually increases. In particular, the best way to increase the duty cycle is to increase it at equal magnifications. Increasing the manner of equal magnification can cause the voltage value of the control voltage Vr to increase accordingly. In one preferred embodiment, the duty cycles of the control signals Sc1, Sc2 are increased by 1%, but not limited thereto. Therefore, the best surge current suppression effect is achieved, and does not cause the pre-charge switch Q to turn on too slowly to prolong the startup time of the electronic circuit 100, or the pre-charge switch Q is turned on too fast to affect the peak current surge suppression effect.

The conversion unit 14 may include at least two circuit structures and control manners, one of which is that the conversion unit 14 is a buck converter, and includes an upper bridge switch Q1 and a lower bridge switch Q2. The upper bridge switch Q1 receives an upper bridge control signal Sc1 of the control signals Sc1, Sc2, the lower bridge switch Q2 receives a lower bridge control signal Sc2 of the control signals Sc1, Sc2, and the upper bridge control signal Sc1 and the lower bridge control signal Sc2 are complementary. When the upper bridge switch Q1 is turned on by the upper bridge control signal Sc1, the lower bridge switch Q2 is turned off by the lower bridge control signal Sc2. At this condition, the work voltage Vcc stores energy to the inductor L through the upper bridge switch Q1 so that the inductor current Il generated by the inductor L charges the capacitor C. Therefore, the voltage value of the control voltage Vr across the capacitor C starts to increase. Afterward, the upper bridge switch Q1 is turned off by the upper bridge control signal Sc1 and the lower bridge switch Q2 is turned on by the lower bridge control signal Sc2. At this condition, the inductor L, the capacitor C, and the lower bridge switch Q2 form a closed loop, and the inductor current Il of the inductor L gradually decreases to release energy to the capacitor C so that the voltage of the control voltage Vr is stably controlled at a fixed value in the steady state.

The other of which is that the conversion unit 14' is a buck converter, and only includes the lower bridge switch Q2. The control unit 12' only supplies the lower bridge control signal Sc2 to the lower bridge switch Q2. The lower bridge switch Q2 is coupled to the work voltage Vcc, the inductor L, and the output end (S, E), and is switched on by the lower bridge control signal Sc2. When the lower bridge control signal Sc2 is a first level (i.e., the low level), the lower bridge switch Q2 is not turned on, and the work voltage Vcc stores energy in the inductor L so that the inductor current Il generated by the inductor L charges the capacitor C. Therefore, the voltage value of the control voltage Vr across the capacitor C starts to increase. Afterward, when the lower bridge control signal Sc2 is a second level (i.e., the high level), the lower bridge switch Q2 is turned on. At this condition, the inductor L, the capacitor C, and the lower bridge switch Q2 form a closed loop, and the inductor current Il of inductor L gradually decreases to release energy to the capacitor C so that the voltage of the control voltage Vr is stably controlled at a fixed value in the steady state.

Both of the above-mentioned two conversion units 14, 14' may include a current limit resistor Rg. When the conversion units 14, 14' start to operate, the magnitude of the turned-on current flowing from the work voltage Vcc through the inductor L to the capacitor C is limited to prevent the pre-charge switch Q from malfunctioning or turning on in unexpected circumstances. Finally, the pre-charge switch gradually turns on the input path according to the control voltage (S400). The pre-charge switch Q gradually establishes a channel by gradually increasing the value of the control voltage Vr to gradually turn on the input path, so that the magnitude of current Ids (or Ice) that flow through the input end D (or C) and the output end S (or E) of the pre-charge switch Q gradually increase.

In summary, the main advantages and effects of the embodiments of the present disclosure are that the pre-charge control circuit only uses the pre-charge switch to be coupled to the input path of the electronic circuit to control the pre-charge of the electronic circuit. The working region of the pre-charge switch is used as the control of turning on the pre-charge switch so that the pre-charge switch of the present disclosure does not need a parallel-connected resistor as in the conventional technology. Therefore, it is possible to achieve complete isolation of the voltage across the pre-charge switch, and it is easy to detect whether the pre-charge switch is damaged.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A pre-charge control circuit is coupled to an input path of the electronic circuit, and the electronic circuit receives an input power from the input path, the pre-charge control circuit comprising:
   a control unit configured to provide a control signal according to a pulse width modulation signal,
   a conversion unit coupled to the control unit and configured to provide a control voltage according to the control signal, and
   a pre-charge switch coupled in series to the input path,
   wherein the control voltage provides to the pre-charge switch, and the pre-charge switch adjusts a magnitude of a current flowing through the input path of the electronic circuit according to the control voltage, and a final voltage of the control voltage is stably controlled at a fixed value, so that the pre-charge switch limits the current flowing through the input path based on the control voltage at the fixed value, the control voltage is the fixed value to set a magnitude of the pre-charge switch channel, thereby limiting the current flowing through the channel.

2. The pre-charge control circuit in claim 1, wherein a duty cycle of the control signal is gradually increased so that the control voltage is gradually increased.

3. The pre-charge control circuit in claim 2, wherein the duty cycle of the control signal is increased in an equal magnification so that a voltage value of the control voltage is increased in corresponding magnification.

4. The pre-charge control circuit in claim 1, wherein the conversion unit comprises:
   a switching unit coupled to the control unit, and
   a filter unit coupled to the switching unit and the pre-charge switch,
   wherein the switching unit and the filter unit are configured to generate the control voltage according to the control signal.

5. The pre-charge control circuit in claim 4, wherein the filter unit comprises:
   an inductor coupled to the switching unit, and
   a capacitor coupled to the inductor and the pre-charge switch.

6. The pre-charge control circuit in claim 5, wherein the switching unit comprises:
   an upper bridge switch coupled to a work voltage and the control unit, and
   a lower bridge switch coupled to the upper bridge switch and the control unit,
   wherein the control signal comprises an upper bridge control signal and a lower bridge control signal complementary to the upper bridge control signal.

7. The pre-charge control circuit in claim 6, wherein the conversion unit further comprises:
   a current limit resistor coupled to the upper bridge switch, the lower bridge switch, and the inductor,
   wherein when the upper bridge switch is turned on, the current limit resistor limits a magnitude of the current flowing through the upper bridge switch.

8. The pre-charge control circuit in claim 5, wherein the switching unit comprises:
   a lower bridge switch coupled to a work voltage and the control unit,
   wherein the control signal is a lower bridge control signal.

9. The pre-charge control circuit in claim 8, wherein the conversion unit further comprises:
   a current limit resistor coupled to the work voltage, the lower bridge switch, and the inductor,
   wherein when the lower bridge switch is turned off, the current limit resistor limits a magnitude of the current flowing from the work voltage through the inductor and the capacitor.

10. A method of controlling a pre-charge control circuit comprising steps of:
    providing a pre-charge switch coupled in series to an input path of an electronic circuit,
    providing a control signal to a conversion unit according to a pulse width modulation signal,
    providing a control voltage to the pre-charge switch, by the conversion unit, according to the control signal, and
    changing a current flowing through the pre-charge switch, according to the control voltage, and a final voltage of the control voltage is stably controlled at a fixed value, so that the pre-charge switch limits the current flowing through the input path based on the control voltage at the fixed value,
    wherein the control voltage is the fixed value to set a magnitude of the pre-charge switch channel, thereby limiting the current flowing through the channel.

11. The method of controlling the pre-charge control circuit in claim 10, wherein a duty cycle of the control signal is gradually increased so that the control voltage is gradually increased.

12. The method of controlling the pre-charge control circuit in claim 11, wherein the duty cycle of the control signal is increased in an equal magnification so that a voltage value of the control voltage is increased in corresponding magnification.

13. The method of controlling the pre-charge control circuit in claim 10, wherein the control signal comprises an upper bridge control signal and a lower bridge control signal complementary to the upper bridge control signal; the upper bridge control signal makes a work voltage store energy to an inductor of the conversion unit, and the lower bridge control signal makes the inductor release energy to a capacitor of the conversion; the capacitor is configured to generate the control voltage through storing energy and releasing energy of the inductor.

14. The method of controlling the pre-charge control circuit in claim 13, further comprising:
    limiting a magnitude of the current flowing from the work voltage through the inductor to the capacitor.

15. The method of controlling the pre-charge control circuit in claim 10, wherein a first level of the control signal makes a work voltage store energy to an inductor of the conversion unit, and a second level of the control signal makes the inductor release energy to a capacitor of the conversion unit; the capacitor is configured to generate the control voltage through storing energy and releasing energy of the inductor.

16. The method of controlling the pre-charge control circuit in claim 15, further comprising:
  limiting a magnitude of the current flowing from the work voltage through the inductor to the capacitor.

\* \* \* \* \*